United States Patent [19]

Tanaka

[11] Patent Number: 4,996,434
[45] Date of Patent: Feb. 26, 1991

[54] ELECTRON-BEAM LITHOGRAPHIC APPARATUS

[75] Inventor: Katsuji Tanaka, Numazu, Japan

[73] Assignee: Toshiba Machine Co., Ltd., Tokyo, Japan

[21] Appl. No.: 341,259

[22] Filed: Apr. 20, 1989

Related U.S. Application Data

[63] Continuation of Ser. No. 71,037, Jul. 8, 1987, abandoned.

[30] Foreign Application Priority Data

Jul. 9, 1986 [JP] Japan .................................. 61-161709

[51] Int. Cl.$^5$ ............................................. H01J 37/30
[52] U.S. Cl. .................................. 250/492.3; 364/491
[58] Field of Search ........................ 250/492.22, 492.2; 364/491

[56] References Cited

U.S. PATENT DOCUMENTS

| | | | |
|---|---|---|---|
| 3,922,546 | 11/1975 | Livesay | 250/492.2 |
| 4,357,540 | 11/1982 | Benjamin et al. | 250/492.2 |
| 4,365,163 | 12/1982 | Davis et al. | 250/492.2 |

Primary Examiner—Jack I. Berman
Attorney, Agent, or Firm—Cushman, Darby & Cushman

[57] ABSTRACT

This invention provides an electron-beam lithographic apparatus in which a predetermined pattern is written on a plate and which has an arrangement for detecting defects in a written pattern. This apparatus includes an apparatus body in which a predetermined pattern is written on a plate, a storage unit for storing therein design data, a CPU for controlling the apparatus body and an interface disposed between the CPU and the apparatus body. The interface includes an unit arranged to detect defects in the pattern formed on a mask by comparing the design data with picked-up image pattern data relative to the mask.

12 Claims, 10 Drawing Sheets

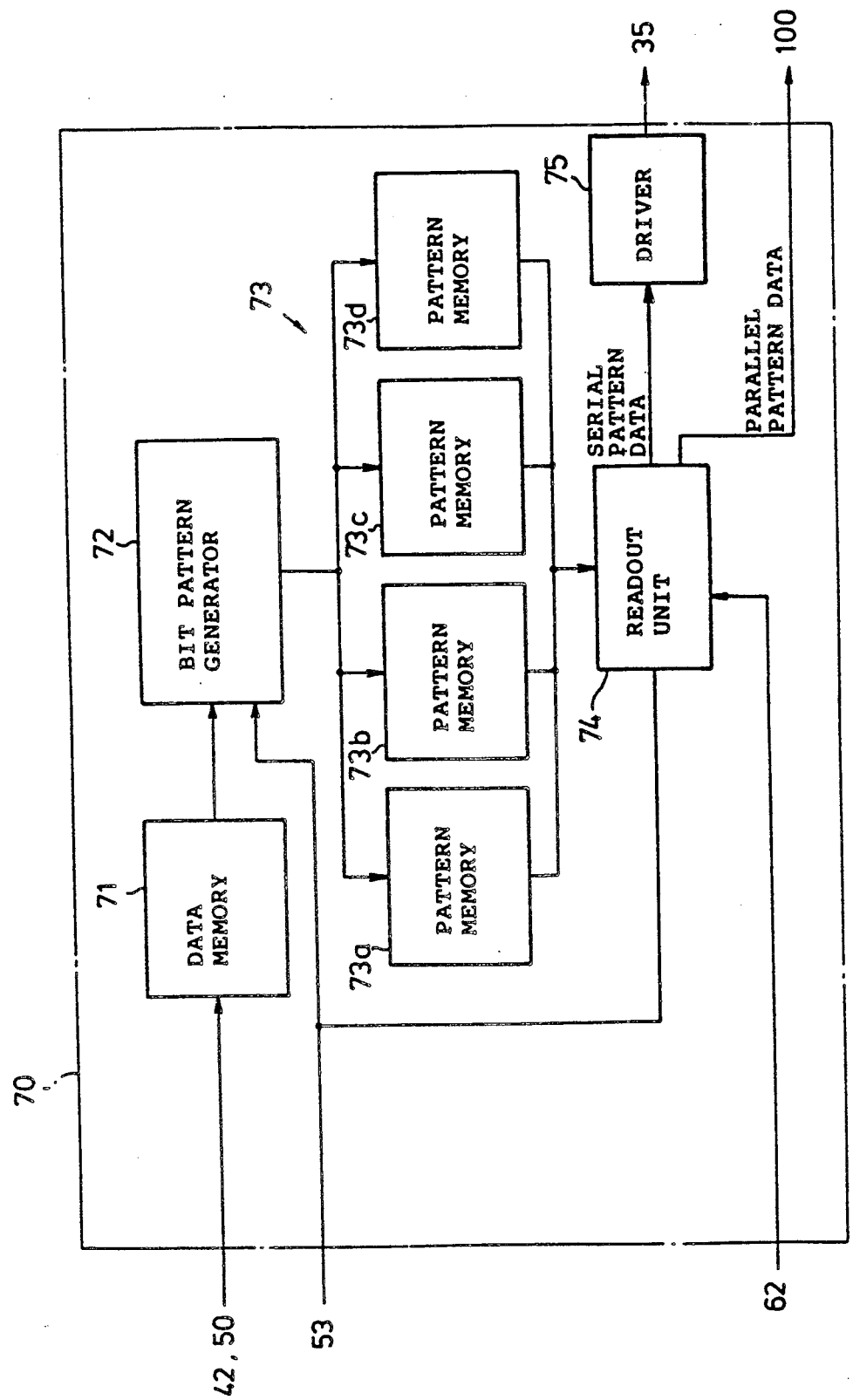

FIG. 3(A)
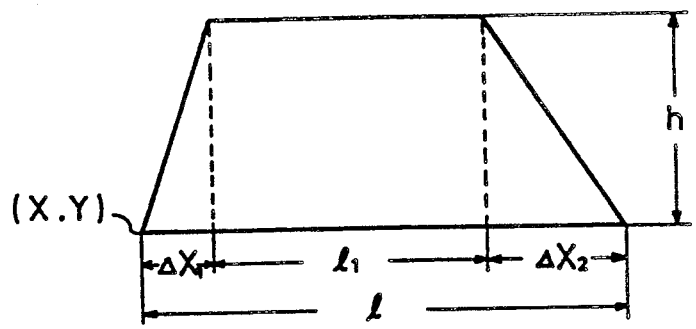
FIG. 3(B)
FIG. 3(C)
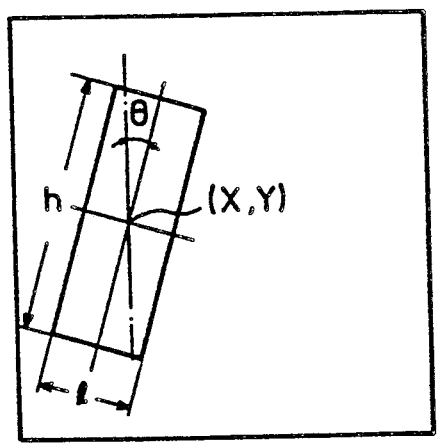

FIG. 5
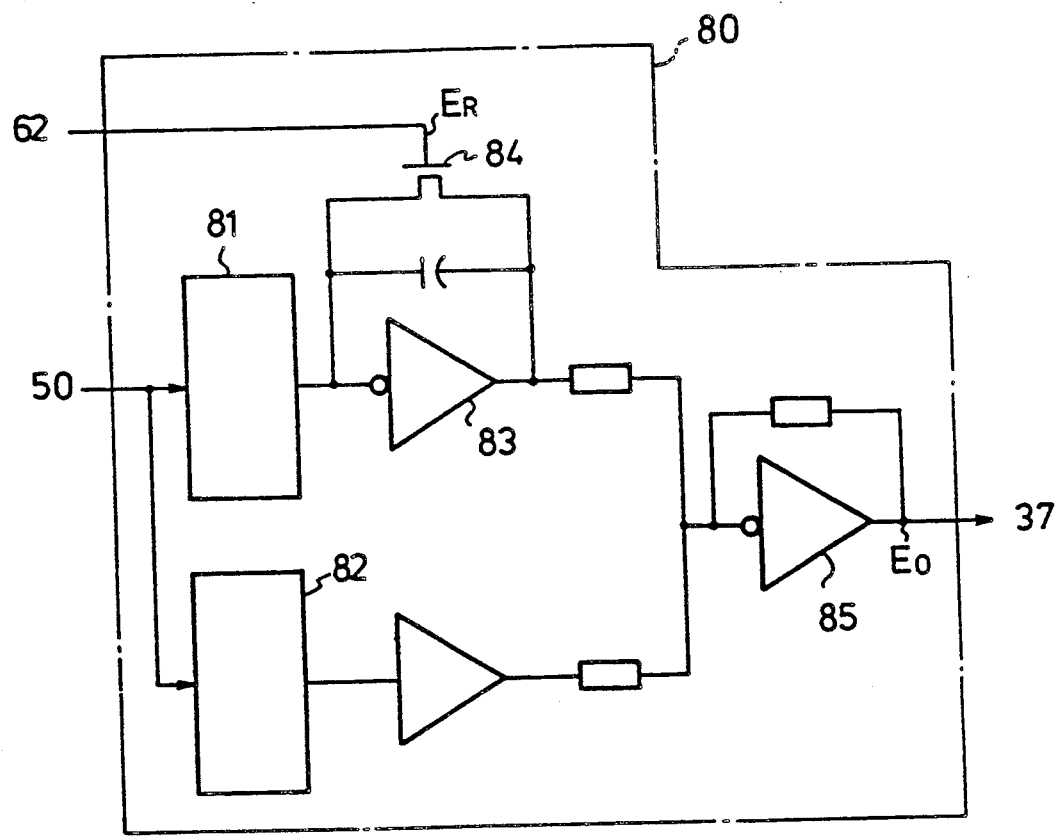
FIG 6A $E_R$
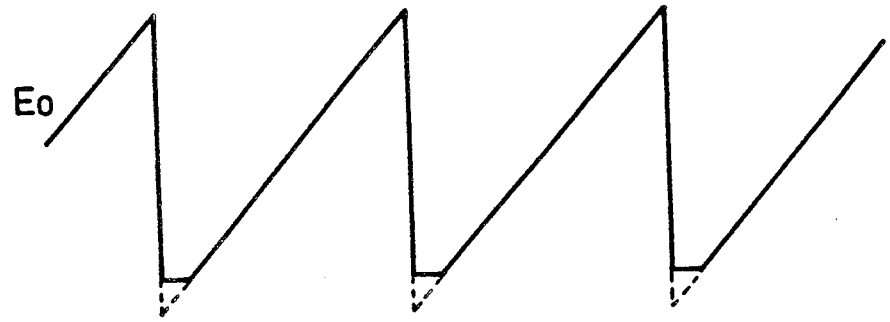
FIG 6B $E_O$

ELECTRON-BEAM LITHOGRAPHIC APPARATUS

This is a continuation of application Ser. No. 07/071,037, filed July 8, 1987, which was abandoned upon the filed hereof.

BACKGROUND OF THE INVENTION

1. Field of the Invention

The present invention relates to an electron-beam lithographic apparatus which is arranged to write a predetermined pattern over the surface of a plate by means of an electron beam under blanking control, and more particularly to a novel electron-beam lithographic apparatus having main pattern-writing functions which can be employed to perform checking operations with respect to a written pattern.

2. Description of the Prior Art

A so-called optical transfer method in which a circuit pattern is optically transferred on a wafer has heretofore been known as a typical method of producing semiconductor integrated circuits such as LSIs on a mass scale. In this optical transfer method, a photomask or a reticle (hereinafter referred to generically as a "mask") is commonly utilized.

Electron-beam lithographic apparatus are widely used as a typical form of mask producing machine, such apparatus being characterized in that fine patterns can be written rapidly and with high precision. In this case, it is well known that the quality of masks employed determines the quality of LSIs or other devices which are obtained. Therefore, patterns written on a mask are normally checked irrespective of whether the mask producing machine employed is one of the aforesaid electron-beam lithographic apparatus.

In general, a conventional type of electron-beam lithographic apparatus is arranged such that the electron beam emitted from an electron gun thereof is placed under blanking control and at the same time under deflection control so as to write a predetermined pattern based on source data input over the surface of a plate such as a chrome coated glass covered with a photosensitive resist.

Also, in order to check masks obtained through the processings such as development and etching of plates containing written patterns, it is common practice to employ a die-to-die comparing type of checking machine, a data-base comparing type of checking machine or a scanning electron microscope.

However, when masks are to be produced using the aforesaid electron-beam lithographic apparatus and checking machine of the prior art, the following problems occur.

(1) The aforesaid die-to-die comparing type of checking machine is arranged such that, as the patterns of adjacent dies disposed on a mask are imaged through two optical systems at the same time, video signals thus obtained are compared. If any disagreement is detected between the video signals, it is judged that the mask has a defect. Accordingly, this die comparing type of checking machine has a critical disadvantage in that, if any defect is contained in two video signals which are coincident with each other, it is impossible to detect such a defect. The aforesaid data-base comparing type of checking machine is typically arranged such that an optically imaged mask pattern is compared with the relevant design data by means of an electronic circuit. Thus, its detecting accuracy depends upon the configurations to be compared with each other. In addition, these machines employing optical image pick-up systems involve optical limitations such as optical wavelength and depth of focus as well as problems derived from the production of lenses. Therefore, the minimum size of a defect which can be detected by the former type of checking machine is about 0.2 $\mu$m while the minimum size in the case of the latter machine is about 0.3 $\mu$m.

Although a checking machine of the type to which a scanning electron microscope is applied has heretofore been proposed, such a checking machine has a problem in that it imposes an excessively heavy burden on the user in an economical sense.

(2) As described above, the checking machine of the prior art involves disadvantage in that it is impossible to check a written pattern of 0.1 $\mu$m or less which might be produced by a lithographic apparatus with increased accuracy. In addition, since the checking machine and the lithographic apparatus are normally disposed in separate relationship, productivity with respect to the production of masks is extremely low. As a matter of course, costs and expenses incurred by equipment increase and a space for installation also increases.

(3) Since the checking machine and the lithographic apparatus are normally arranged in separate relationship, if each machine or apparatus uses different type of machine data, it is necessary to modify the procedures and method for converting source data or intermediate format data to corresponding machine data. Accordingly, an extremely prolonged period is required for data preparation, and in addition, errors in data discrimination may occur. This could lead to a problem in that it becomes difficult to ensure the detecting accuracy of the checking machine.

SUMMARY OF THE INVENTION

It is therefore an object of the present invention to provide an electron-beam lithographic apparatus which is arranged to effect checking rapidly and with high precision by effectively using their own lithographic operations.

To this end, the present invention has been devised by noticing the fact that the problems of the prior art is attributed to an arrangement in which a lithographic apparatus and a checking machine are arranged in separate relationship with each other as well as on the basis of the fundamentals in which the quality of masks can be maintained through control of the entire process of production. The present invention provides an arrangement in which lithographic and checking operations may be selectively performed, thereby eliminating the problems of the prior art.

The aforesaid object is achieved b the present invention providing an electron-beam lithographic apparatus adapted to expose a pattern with an electron beam under blanking control on the basis of a set of design data thereby writing a predetermined pattern over the plate, comprising: image detecting means for detecting electrons reflected from a mask to pick up the image of a pattern formed on the mask; picked-up image pattern data from the output of the image detecting means in correspondence with design pattern data based on the design data; and comparison-check means arranged to detect defects on the mask by comparing the design pattern data with the picked-up image pattern data so that the mask is checked while the electron beam is being scanned.

In accordance with the present invention, a pattern is exposed with an electron beam under blanking control on the basis of a set of design data, and thus a predetermined pattern can be written over the plate. In addition, if the written plate is removed and a mask produced through predetermined processings such as etching is loaded in the apparatus and then a checking operation is selected, an electron beam is scanned in the same manner as the beam scan in the pattern-writing operation. Thus, the comparison-check means compares the design pattern data based on the aforesaid design data with the picked-up image pattern data supplied from the picked-up image pattern data generating means on the basis of detected electrons reflected from the image detecting means, thereby enabling detection of defects in the pattern on the mask. In this way, it is possible to check the mask rapidly and with high precision by directly utilizing the beam deflection means and the like which are used in a pattern-writing operation.

BRIEF DESCRIPTION OF THE DRAWINGS

FIG. 2 is a block diagram of a bit conversion unit incorporated in the first preferred embodiment;

FIGS. 3(A) to 3(C) are used as an aid in explaining format conversion performed in the first preferred embodiment; FIG. 3(A) showing a geometric representation format characteristic of the presently preferred apparatus, FIG. 3(B) showing an example of CAD data format used in the same, and FIG. 3(C) showing an intermediate format used in the same;

FIG. 5 is a circuit diagram showing the construction of a deflection control unit incorporated in the first embodiment;

FIG. 6(A) is a timing chart of a reset signal used in the first embodiment;

FIG. 6(B) is a timing chart of a scanning width signal;

DETAILED DESCRIPTION OF THE PREFERRED EMBODIMENTS

Figure 1:
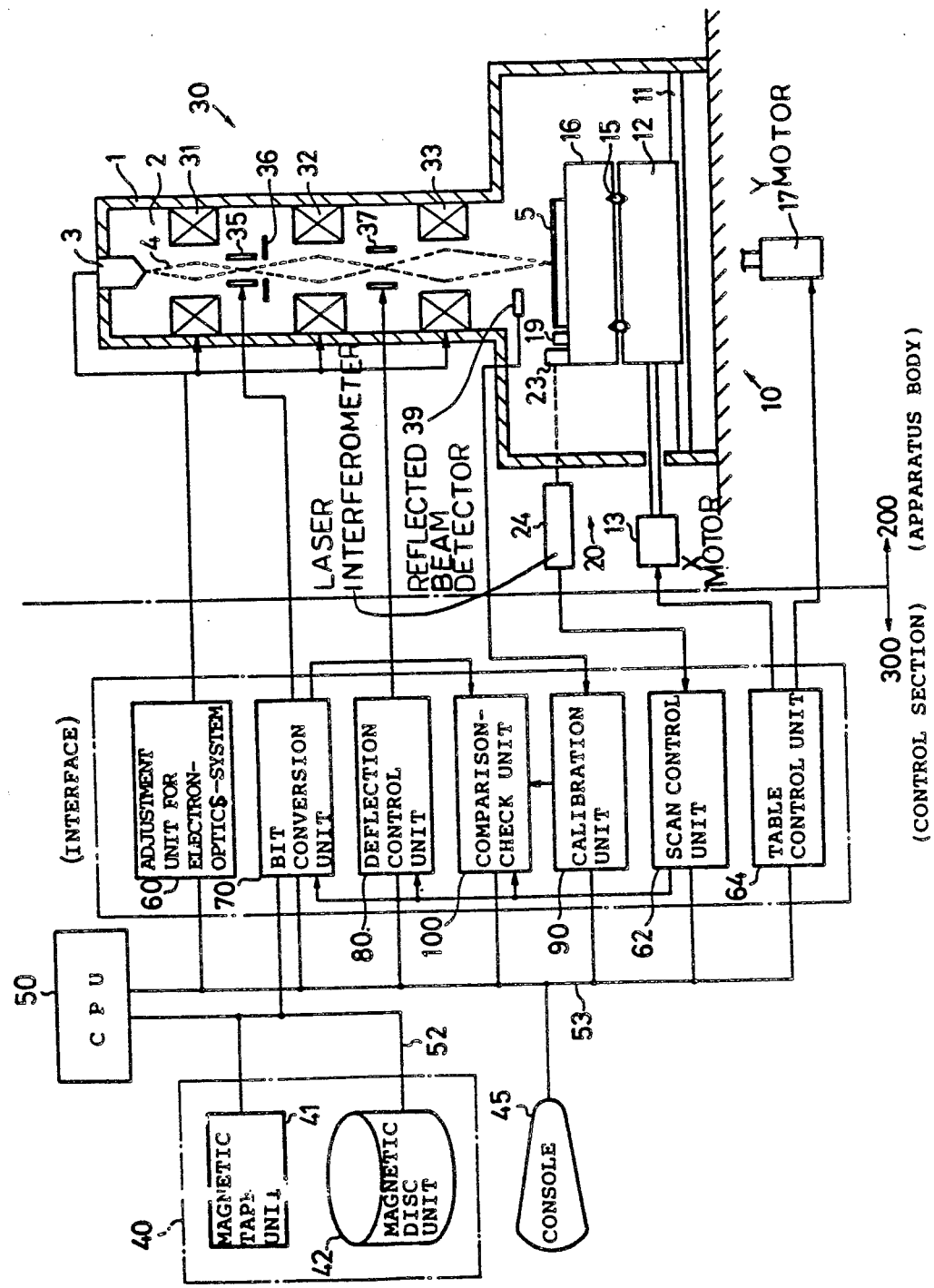
FIG. 1 is a diagrammatic illustration of the overall construction of a first preferred embodiment of an electron-beam lithographic apparatus in accordance with the present invention.
Figure 4A:
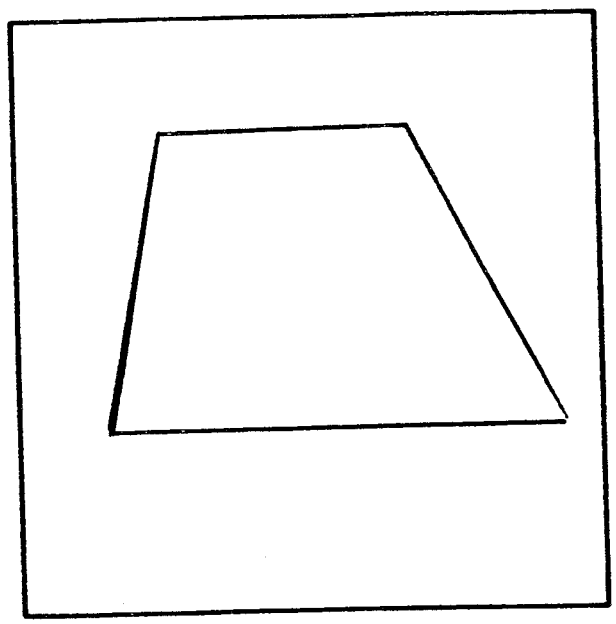
FIGS. 4(A) and 4(B) are used as an aid in explaining the contents of bit conversion performed in the first embodiment, FIG. 4(A) showing a geometric representation format characteristic of the presently preferred apparatus and FIG. 4(B) showing bit data.
Figure 4B:
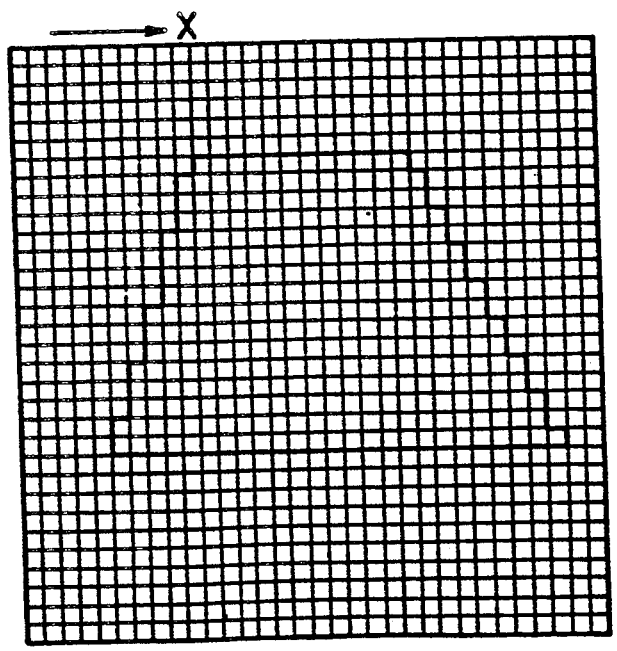

Preferred embodiments of an electron-beam lithographic apparatus of the present invention will be described in detail below with reference to the accompanying drawings.

First Embodiment

FIGS. 1 to 10 show a first preferred embodiment of an electron-beam lithographic apparatus of this invention. The apparatus constituting the first embodiment is essentially comprised of an apparatus body 200 and a control section 300. The apparatus body 200 is arranged such that, while an electron beam is being scanned over the surface of a plate, pattern writing and a check thereof may be effected. The control section 300 includes: external storage means 40 for storing therein a set of design data which is used as source data; a CPU 50 for executing various processings such as the conversion from source data to machine data, the issuance of control commands to the apparatus body 200 and the like; and a bit conversion unit 70 and other associated units 60, 62, 64, 80, 90 and 100 which constitute in combination an interface for providing specific matching between the CPU 50 and the apparatus body 200.

The aforesaid constituent elements will be separately described below.

The apparatus body 200 is controlled by the CPU 50 through the aforesaid interface, and has an airtightly assembled frame 1 constituting a vacuum chamber 2 which accommodates a table drive means 10, a position measurement system 20 and an electron-optics system 30. The table drive means 10 is disposed so that a plate 5 on which pattern writing or checking is to be effected is caused to travel in the direction of either the X-axis or the Y-axis. The table drive means 10 includes an X table 12 slidably carried on X-axis rail means 11 and an Y table 16 slidably carried on Y-axis rail means 15, the X table 12 being adapted to be moved in the X-axis direction by an externally installed X motor 13 with the Y table 16 being adapted to be moved in the Y-axis direction by an externally installed Y motor 17. Accordingly, the plate 5 is made to travel in the direction of either the X-axis or the Y-axis via a table control unit 64 on the basis of a command issued by the CPU 50. The position measurement system 20 is constituted by an X plane mirror 23 secured to the top of the Y table 16 and a laser interferometer 24 including a beam source for irradiating the X plane mirror 23 with a laser beam, thereby detecting displacements of the X table 12 through the Doppler effect by making a reference beam interfere with beam reflected from the mirror 23. Incidentally, although not specifically illustrated, a similar arrangement is disposed for detecting positions in the Y-axis direction. The electron-optics system 30 includes a first stage condenser lens 31, a second stage condenser lens 32 and an objective 33 which are arranged in this order in the vertical direction in order to effect beam control. An electron beam 4 emitted from an electron gun 3 disposed at the top of the frame 1 may be focused to a predetermined beam diameter and illuminate a predetermined position on the plate 5. The electron gun 3 includes a cathode from which electrons are emitted and an anode by which an electron beam is accelerated. A pair of blanking electrodes 35 and an aperture forming member 36 are disposed at an intermediate position between the first stage of condenser lens 31 and the second stage of condenser lens 32 for the purpose of effecting blanking control. A pair of deflection electrodes 37 are disposed at an intermediate position between the second stage of condenser lens 32 and the stage of objective 33 for the purpose of deflecting an electron beam in the X-axis direction.

The respective voltages applied to the deflection electrodes 37 can be controlled to shift in the X-axis direction the position of an electron beam which illuminates the plate 5. Although another pair of deflection electrodes relative to Y-axis deflection is also disposed in combination with the aforesaid pair of deflection electrodes 37, the illustration thereof is omitted for the sake of simplicity.

A reflected beam detector 39 is disposed as image detecting means at a location above the Y table 16, and is arranged to detect electrons reflected from the plate 5, thus outputting the obtained data to the calibration unit 90 which constitutes an picked-up image pattern data generating means.

Although evacuation control means is disposed so as to maintain the pressure inside the vacuum chamber 2 at a predetermined level and automatic loading control means is disposed so as to load and unload the plate 5, description and illustration of these are is omitted for the sake of simplicity.

The external storage means 40 constituting one part of the control section 300 includes a magnetic tape unit 41 and a magnetic disc unit 42. The magnetic tape unit 41 has a set of design data or source data which is supplied to an input of the CPU 50. The CPU 50 converts the source data supplied from the magnetic tape unit 41 into corresponding machine data characteristic of the apparatus body 200. The magnetic disc unit 42 reads the machine data from the CPU 50 and stores it therein in the form of data which is available for the succeeding pattern writing or checking.

The CPU 50 including the main memory is connected to the external storage means 40 and the bit conversion unit 70 via a high-speed DMA bus 52 and an I/O bus 53, respectively. The CPU 50 has a so-called data preparation function of converting source data to machine data, a control/drive function and the like, and controls the present apparatus in a centralized manner. A console indicated at 45 is used to perform various operations such as changeover between write and check modes.

As shown in FIG. 1, the interface includes the constituent units 60, 70, 80, 100, 62 and 64, and interprets macro codes issued from the CPU 50 to control the table drive means 10, the electron-optics system 30 and the like of the apparatus body 200. For this reason, the interface includes the constituent units 60, 70 and other necessary components such as digital circuits, analog circuits, drivers and the like.

The electron-optics system adjustment unit 60 perform adjustment of the electron-optics system 30 in cooperation with the table drive means 10, the position measurement system 20, the deflection control unit 80, the reflected-beam detector 39 for detecting the quantity of reflected electrons, the calibration unit 90 and the like. In this case, the adjustment of the electron-optics system 30 includes various kinds of adjustments relative to beam-path alignment, a beam current, a beam diameter, the astigmatism of a beam spot (the illustration of a coil for adjusting the astigmatism of beam spot is omitted), and this enables suitable performance of the writing and checking of patterns When conditions, such as a pattern to be written, are modified, the aforesaid adjustment is carried out, and also, such adjustment can be automatically performed at predetermined time intervals in order to compensate for variations with time. More specifically, while the quantity of electrons reflected from a mark 19 secured to the Y table 16 is being detected through the reflected beam detector 39, the respective lens 31, 32, 33 and the like are adjusted. Also, in order to obtain a deflection sensitivity with respect to an electron beam, a predetermined controlled variable is supplied from the CPU to the deflection control unit 80, and an actual distance traveled by an electron beam based on such a variable is confirmed by means of the mark 19, the position measurement system 20 and the like. In principle, the electron-optics-system adjustment unit 60 is not used during a regular pattern writing or checking operation.

The bit conversion unit 70 serves to convert pattern data (machine data) stored in the magnetic disc unit 42 to a bit pattern data suitable for blanking control. The pattern data is obtained by supplying design data (CAD data or the like) to the CPU 50 from the magnetic tape unit 41, converting the data to corresponding machine data in the CPU 50 through format conversion for generating geometrically compressed data in the form of an intermediate format, and storing the thus-converted data in the magnetic disc unit 42. In particular, the bit conversion unit 70 in the first preferred embodiment is adapted to effect parallel readout so as to perform a pattern writing operation and a checking operation selectively.

More specifically, as shown in FIG. 3(A), in the first embodiment of the electron-beam lithographic apparatus, the machine data characteristic of the apparatus is represented in a geometric representation mode employing a trapezoidal figure having upper and lower sides which are parallel with each other. The design data which is used as source data is represented, for example, by a rectangle shown in FIG. 3(B) which is specified by $\theta$, h and l where the coordinates of the center is (X, Y). In practice, however, it is extremely difficult to convert the design data into the corresponding machine data all at one time. Accordingly, as shown in FIG. 3(C), the design data which is used as source data is temporarily divided in the form of a grating (cells), followed by data conversion.

More specifically, if it is determined that $\Delta X_1 = 0$ and $\Delta X_2 = 0$ in the trapezoidal pattern shown in FIG. 3(A), a cell Cmn shown in FIG. 3(C) is converted into machine data defined by $h \times l_1$. The cells are $1024 \times 1024$ addressable units.

As shown in FIG. 2, the bit conversion unit 70 includes a data memory 71, a bit pattern generator 72, a pattern memory group 73 and a readout unit 74. The data memory 71 stores therein data corresponding to one cell as one block, the data being transferred from the magnetic disc unit 42 via the CPU 50. The bit pattern generator 72 reads in the pattern data shown in, for example, FIG. 4(A) which is stored in the data memory 71, and then converts the thus read data to the bit pattern shown in FIG. 4(B). The pattern memory group 73 includes four pattern memories 73a, 73b, 73c and 73d each storing therein each piece of the converted bit pattern equivalent to one cell. When the Y table 16 moves to a pattern-writing start position Ps (refer to FIG. 8), the scan control unit 62 outputs a timing signal. In response to the timing signal, the readout unit 74 reads in the contents of the pattern memory group 73 in the direction indicated by an arrow X of FIG. 4(B), and sends a blanking signal through a driver 72 to the blanking electrodes 35 in the form of binary-coded serial pattern data. When a check mode command is given by the CPU 50 for the purpose of a checking operation, the readout unit 74 is adapted to send data in a parallel manner to a comparison-check unit 100 which will be described later.

As shown in FIGS. 5, 6(A) and 6(B), the deflection control unit 80 includes a deflection D/A converter 81, an integrator 83, a deflection start position D/A converter 82 and an adder 85. The deflection width D/A converter 81 performs conversion to an analog signal from a digital signal representative of a deflection width which is issued from the CPU 50. The integrator 83 integrates the thus-converted signal to generate a signal having a saw-tooth wave form. The deflection start position D/A converter 82 effects conversion to an analog signal from a digital signal representative of a deflection start position which is issued from the CPU 50. The adder 85 adds the analog signals which are obtained by the integrator 83 and the deflection start position D/A converter 82, and then outputs a deflection control signal to the deflection electrodes 37. The aforesaid deflection electrodes 37 shown in FIG. 1 are designed for X-axis deflection, and no Y-axis deflection electrode is shown for the sake of simplicity. Therefore, the deflection control unit 80 is normally formed having two lines each provided with the constituent elements such as the adder 85 shown in FIG. 5.

It is to be noted that deflection control needs to be synchronized with scan control. For this reason, in response to a timing signal (refer to FIG. 6(A)) output from the scan control unit 62, the deflection control unit 80 is adapted to short-circuit a switch 84 as shown in FIG. 6(B), thereby resetting the integrator 83.

The deflection control unit 80 is also provided with a function of compensating for variations in the position of pattern in response to a signal from the position measurement system 20 which detects at real time the lateral zigzag motions and vibrations of the tables 12 and 16. Accordingly, it is possible to further improve the accuracy of pattern writing and of the checking thereof. In addition, the deflection control unit 80 is capable of compensating for variations in the width of a beam scan in response to a signal from a sensor (not shown) for detecting the vertical motion of the Y table 16.

Figure 7:
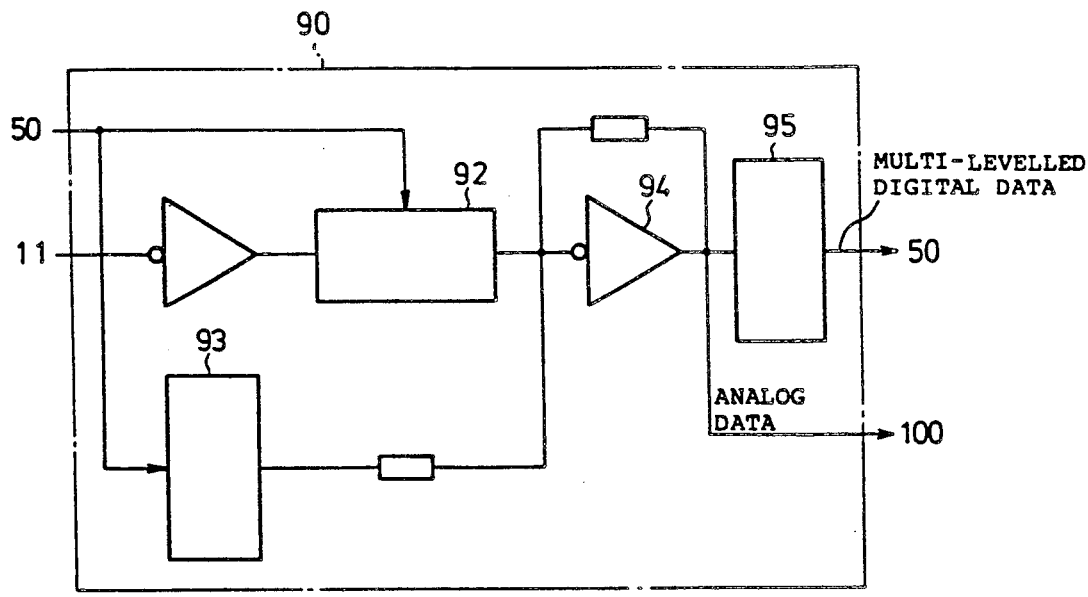
FIG. 7 is a circuit diagram showing the construction of a calibration unit including a picked-up image pattern data generating means.

The calibration unit 90 generates a feedback signal in order to adapt the electron-optics system 30 for desired pattern-writing or checking conditions in association with the electron-optics-system adjustment unit 60, as described above. As shown in FIG. 7, the calibration unit 90 includes a gain adjusting D/A converter 92, a biasing D/A converter 93 and an adder 94 which shape in combination the wave form of an output signal from the reflected-electron detector 39 on the basis of a gain adjustment value and a bias value respectively supplied from the CPU 50. The calibration unit 90 further includes an A/D converter 95 for outputting a digital signal in the form of multi-levelled data which can be easily read into the CPU 50. As is evident from the foregoing, the calibration unit 90 is not used during a pattern-writing operation, but is used when automatically calibrating each parameter of the electron-optics system 30.

It is to be noted that, since the calibration unit 90 constitutes a picked-up image pattern data generating means in relation to the comparison-check unit 100 which will be described later, the adder 94 is capable of outputting an analog signal.

The scan control unit 62 counts an up/down pulse signal which is generated from the position measurement system 20 concurrently with the travel of each of the X table 12 and the Y table 16 and calculate the respective current position of the tables 12 and 16, thereby enabling the CPU 50 to read in the positions at any time (a Y-axis position measurement system is not shown in FIG. 1). The scan control unit 62 is also arranged to receive command signals representative of a scanning start position Ps, a scanning pitch P, the number of linescans which command signals are issued from the CPU 50. Thus, when the scanning start position Ps is reached, the scan control unit 62 sends a timing signal to the deflection control unit 80 whereas, when the specified number of linescans has been completed, the unit 62 is adapted to stop the linescan.

Figure 8:
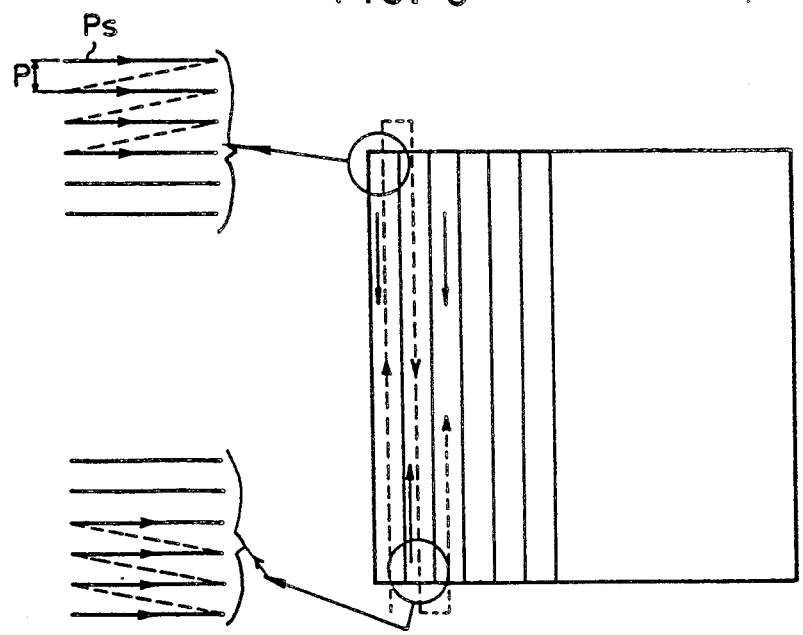
FIG. 8 is a view used as an aid in explaining the beam scan and plate movement carried out in the first embodiment.

As shown in FIG. 8, in order to write a pattern in the first embodiment of the electron-beam lithographic apparatus, an electron beam is scanned in the X-axis direction by means of the X-axis deflection electrodes 37 while the Y table 16 is being moved continuously in the Y-axis direction with the X table 12 being intermittently moved. In this way, an electron beam is made to travel along each stripe of scan field in a zigzag manner as indicated by a dotted line in FIG. 8, and the process is sequentially repeated in the direction of solid lines shown in FIG. 8.

On the basis of the speed, direction, and distance to be travelled which are specified by the CPU 50, the table control unit 64 drives the motors 13 and 17 via a built-in driver (not shown) to control the X and Y tables 12 and 16.

Accordingly, if the electron-optics-system adjustment unit 60 and the calibration unit 90 are used to calibrate the electron-optics system 30 so as to adapt it for desired pattern-writing conditions and the apparatus body 200 is controlled by supplying command signals under predetermined procedures from the CPU 50 to the bit conversion unit 70, the deflection control unit 80, the scan control unit 62 and the table control unit 64, a predetermined pattern based on a set of design data stored in the magnetic tape unit 41 can be written over the surface of the plate 5 mounted on the Y table 16.

Figure 9:
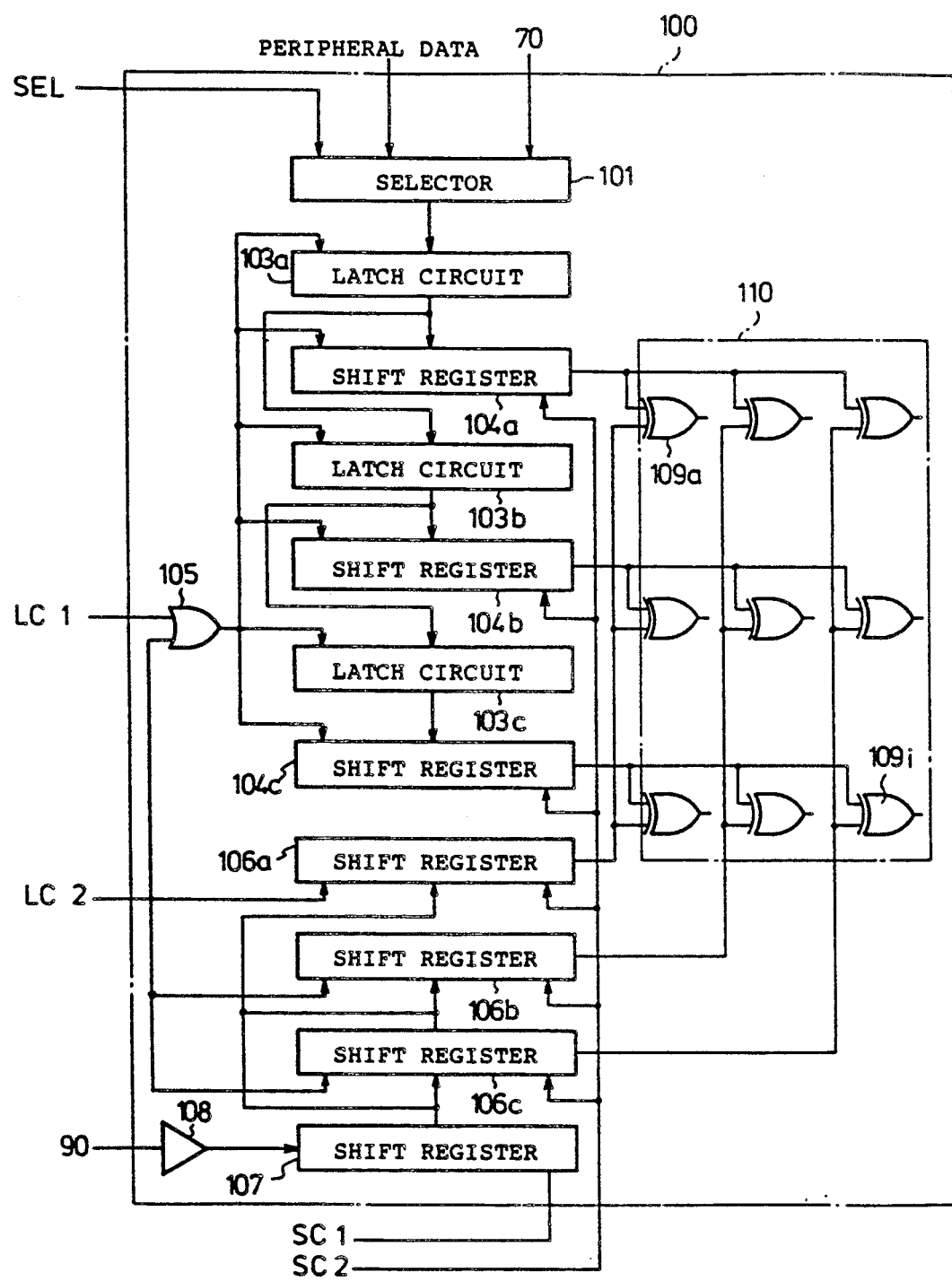
FIG. 9 is a circuit diagram showing the construction of a comparison-check unit incorporated in the first embodiment.

FIG. 9 show s the construction of the comparison-check unit 100 serving as comparison-check means which enables a checking operation characteristic of the present invention.

The comparison-check unit 100 essentially includes: three latch circuits 103a, 103b, 103c; three shift registers 104a, 104b, 104c; a shift register 107; three shift registers 106a, 106b, 106c; a comparator circuit 110; and a selector 101.

More specifically, a mask subjected to patternwriting followed by processing such as development and etching is positioned and placed on the Y table 16 as in the case of the aforesaid plate 5.

The three latch circuits 103a, 103b and 103c are connected to an OR gate 105 having two inputs; one input thereof receives a load clock LC1 output from the scan control unit 62 immediately before the Y table 16 starts to travel while the other input receives a load clock LC2 which is generated after the reflected-beam detector 39 as image detecting means has detected electrons reflected from a mask during a first scanning. The three shift registers 104a, 104b and 104c respectively store therein parallel pattern data or the like latched in the associated latch circuits 103a, 103b and 103c. The shift register 107 stores therein an picked-up image data which is a digital signal generated by a comparator 108 from an analog signal supplied from the calibration unit 90 serving as the picked-up image pattern data generating means. Each time the load clock LC2 is input to the three shift registers 106a, 106b and 106c, they store therein the contents stored in the shift register 107 subsequently to a predetermined process. The comparator circuit 110 includes nine exclusive OR gates (Ex-OR gates) 109a to 109i which compares in turn each of the contents of the shift registers 104a, 104b and 104c with each of those of the shift registers 106a, 106b and 106c. The selector 101 selectively allows the entry of peripheral data (the peripheral data represents the periphery of a region defined by a set of design data and is constituted by "0"s or "1"s) and parallel pattern data supplied from the bit conversion unit 70 in response to a data selecting signal SEL which is maintained at a high level after a first load clock signal LC1 has been developed in the aforesaid latch circuit 103a. The latch circuits 103a, 103b, 103c and the shift registers 104a, 104b, 104c constitute a first storage means while the shift registers 106a, 106b, 106c and 107 constitute a second storage means.

Three load clocks LC1 are generated before the Y table 16 starts to travel. At the time of generation of a first one, since the data selecting signal SEL is "0", the peripheral data is loaded into the latch circuit 103a via the selector 101. At the time of generation of a second or subsequent load clock, since the data selecting signal SEL is set to "1", the parallel pattern data supplied from the bit conversion unit 70 is loaded into the latch circuit 103a via the selector 101. Therefore, at the time of generation of a third load clock, the peripheral data, a bit pattern equivalent to a first scan and a bit pattern equivalent to a second scan are respectively loaded into the latch circuit 103c, the latch circuit 103b and the latch circuit 103a.

Thereafter, when the Y table 16 moves to the scanning start position Ps (refer to FIG. 8), a shift clock SC1 is generated, and thus a digital signal which is derived through the binary-coding by the comparator 108 from an analog signal output from the calibration unit 90 is loaded into the shift register 107. The shift clock signal SC1 is synchronized with the beam scan performed by the deflection control unit 80 on the basis of the timing signal generated by the scan control unit 62.

In this manner, picked-up, binary coded image data corresponding to a mask which is loaded in the shift register 107 is formed including an extra adjoining portion equivalent to one pixel (one bit) added to each of the right and left sides of the parallel pattern data from the calibration unit 90.

Subsequently, when the first-scan image pick-up has been completed, one load clock LC2 is generated. Thus, the peripheral data, the pattern data equivalent to the first scan and the pattern data equivalent to the second scan loaded in the corresponding latch circuits 103c, 103b and 103a are respectively loaded into the shift registers 104c, 104b and 104a. Simultaneously, the picked-up image data loaded in the shift register 107 is loaded into the shift registers 106a, 106b and 106c at substantially the same timing. In this case, the shift registers 106a, 106b and 106c are connected to the shift register 107 in such a manner that the contents which are shifted one pixel (one bit) to the right are loaded into the shift register 106c, the contents which are shifted one pixel (one bit) to the left being loaded into the shift register 106a, and the original contents of the shift register 107 being loaded into the shift register 106b.

In a case where picked-up image data obtained by the second or subsequent scan is to be loaded into the shift register 107, the load clocks LC1 and LC2 no longer relate to such loading, and thus the signals SC1 and SC2 energize the circuit at the same time.

Accordingly, each of the outputs from the shift registers 104a, 104b and 104c is compared with each of the outputs of the shift registers 106a, 106b and 106c in the nine Ex-OR gates 109a to 109i.

The comparator circuit 110 consisting of the nine Ex-OR gates 109a to 109i is constructed so as to compare the respective outputs while allowing for $\pm$ 1 pixel in each of the X and Y directions. This eliminates the problem of an alignment error confusing the process of comparison or judgment, thereby assuring positive check of a pattern.

Although not specifically shown, the processing of the outputs from the comparator circuit 110, that is, the Ex-OR gates 109a to 109i are performed in the following manner, thereby making judgment as to the presence or absence of a defect. (1) The respective outputs are temporarily loaded into shift registers (not shown), and at this time counting is made only with respect to the number of pixels corresponding to "1" representative of the disagreement between data which are compared with each other. (2) The contents of a shift register which shows the minimum count value are stored in a memory map (not shown). (3) As the result of retrieval in the memory map, if two or more "1"s appear one after another longitudinally, laterally, or in the direction of 45 degrees, it is judged that there is a defect.

As described above, the first preferred embodiment of the electron-optical lithographic apparatus includes the constituent elements serving to write a pattern and the comparison-check unit 100 connected thereto, in which the pattern data which is the picked-up image data supplied from the calibration unit 90 is compared with the pattern data which is based on the design (source data) supplied from the bit conversion unit 80 by effectively utilizing the scan timing signal from the scan control unit 62 and the position data relative to the tables 12 and 16, thereby enabling judgement as to the presence or absence of a defect.

It is to be noted that the first preferred embodiment of the electron-beam lithographic apparatus is further provided with a monitor (not shown) which enables visual inspection of a defective pattern detected by the aforesaid checking operation for the sake of quality control or convenience of other operating factors. Moreover, the apparatus has the function of storing a defective pattern in the magnetic disc unit 42, calculating the coordinates and size of the stored pattern and outputting the result to externally connected equipment, and in addition, the function of, after completion of a checking operation, positioning the coordinates of the defective pattern while the tables 12 and 16 are again being moved, thereby outputting an SEM image.

The operation of the first embodiment will be described below.

Writing Pattern

First, the electron-optics system 30 is adjusted in accordance with pattern-writing conditions. This is performed by energizing the electron-optics-system adjustment unit 60 and controlling the first condenser lens 31, the second condenser lens 32 and the objective 33 by means of the CPU 50 and the calibration unit 90 responsive to a feedback signal supplied from the reflected-beam detector 39 which detects the quantity of electrons reflected from the mark 19 fixed to the top of the Y table 16. This adjustment provides a beam diameter, a beam current, a beam-path alignment, the astigmatism of a beam spot and the like in accordance with the pattern-writing conditions. Also, the CPU 50 supplies a predetermined controlled value to the deflection control unit 80, thereby adjusting a beam deflection sensitivity in cooperation with the table drive means 10, the position measurement system 20, the calibration unit 90 and the like.

Subsequently, the plate 5 is placed on the Y table 16 as a target on which a desired pattern is written.

Pattern writing is performed by effecting format conversion with respect to the design data read out of the magnetic tape unit 41, outputting bit serial data as a blanking signal while the intermediate format data held in the magnetic disk unit 42 as data to be written is being converted to a corresponding bit pattern in the bit conversion unit 70 and controlling the blanking electrodes 35.

If the blanking signal applied to the blanking electrodes 35 is "0", the electron beam from the electron gun 3 is irradiated onto the plate 5 while, if the blanking signal is "1", the electron beam is blocked by the aperture forming member 36. Accordingly, while the Y table 16 is being moved as shown in FIG. 8 by the cooperation between the scan control unit 62 and the table control unit 64, a first stripe is written in the X-axis direction by means of the deflection control unit 80. When the first strip has been written, the X table 12 is moved to the position of a second stripe, and the Y table 16 is moved in the reverse direction. In consequence, a predetermined pattern can be written over a predetermined region on the plate 5 in a zigzag manner as shown by dotted lines in FIG. 8.

Mask Formation

After completion of the pattern writing, the plate 5 containing the written pattern is removed from the Y table 16, developed by a separately disposed machine (not shown), followed by etching or other predetermined known procedures, thereby forming a mask.

The thus-produced mask or a mask produced by the separately disposed lithographic device is set at a predetermined position on the Y table 16.

Checking Operation

In a checking operation as well, the electron-optics system 30 is adjusted as in the case of the pattern-writing operation, and this adjustment is substantially the same as that the pattern writing. However, the checking operation further includes the step of adjusting the levels of gain and bias by means of the gain adjusting D/A converter 92 and the biasing D/A converter 93 which are included in the calibration unit 90 serving as picked-up image data generating means so that the relationship between the relevant signal level and the contrast between portions containing a pattern and no pattern may be established within a predetermined range of gain and bias required for the checking operation.

Subsequently, the pattern defined over the mask is scanned under the same procedures as those of pattern writing through the cooperation among the bit conversion unit 70, the deflection control unit 80, the scan control unit 62 and the table control unit 64 on the basis of the aforesaid design data. In this case, when using a patterned mask produced by a separately installed machine, a set of design data corresponding to the mask is saved into the magnetic disk unit 42.

Subsequently, during a beam scan, the readout unit 74 of the bit conversion unit 70 supplies a signal representative of "1" to the blanking electrodes 35 via the driver 75 while, during a flyback period, the readout unit 74 supplies a signal representative of "0" to the blanking electrodes 35. In the meantime, the parallel pattern data of the readout unit 74 is entered into the comparison-check unit 100 (into the selector 101). In addition, peripheral data is entered into the selector 101 of the comparison-check unit 100, and analog data as picked-up image data is supplied in digital form from the calibration unit 90 through the comparator 108 to the shift register 107.

The aforesaid process will be described in detail below.

(1) Before the Y table 16 starts to move, that is, before a checking operation is started, three load clocks LC1 are generated by the scan control unit 62. At the time of generation of a first pulse, since the data selecting signal SEL is "0", peripheral data is loaded into the latch circuit 103a via the selector 101. More specifically, since the loaded peripheral data is representative of the periphery of a region in which a pattern is written, the peripheral data contains "0"s or "1"s in its all places.

It is to be noted that, at the time of generation of a second or subsequent pulse, the signal SEL is set to "1" and acts to effect loading of parallel pattern data via the selector 101 from the bit conversion unit 70. In this way, when a third load clock LC1 is output, parallel pattern data corresponding to a second scan, parallel data corresponding to a first scan and the peripheral data are respectively latched in the latch circuit 103a, 103b and 103c.

(2) When the traveling Y table 16 reaches the scanning start position Ps (FIG. 8) toward the end of such data set-up, the shift clock SC1 is generated on the basis of a timing signal of the scan control unit 62 which provides synchronization with the beam scan controlled by the deflection control unit 80. Thus, the picked-up image which is binary-coded by the comparator 108 is loaded into the shift register 107 by the calibration unit 90.

In this case, the picked-up image data loaded in the shift register 107 is formed including an extra adjoining portion equivalent to one pixel (one bit) added to each of the right and left sides of the parallel pattern data from the bit conversion unit 70. As described later, such extra portions are employed to compare the design data and the picked-up image data in matrix form.

(3) When the first-scan image pick-up has been completed, one load clock LC2 is generated. Thus, design corresponding to the second scan, design data corresponding to the first scan and the peripheral data are respectively loaded in a parallel manner from the latch circuits 103a, 103b and 103c under control of the OR gate 105 into the corresponding shift registers 104a, 104b and 104c.

In the meantime, the picked-up image data loaded in the shift register 107 is also loaded into the shift registers 106a, 106b and 106c in a parallel manner. The contents of the shift register 107 which are shifted one pixel (one bit) to the left are loaded into the shift register 106a, the contents which are shifted one pixel (one bit) to the right being loaded into the shift register 106c, and the original contents of the shift register 107 being loaded into the shift register 106b.

Subsequently, when the second scan has been completed, the scan signals $SC_1$ and $SC_2$ energize the circuit at the same time. Thereafter, design data and picked-up image data derived from the mask are respectively loaded into the shift registers 104a, 104b, 104c and 106a, 106b, 106c. After pattern data corresponding to the final scan has been loaded via the bit conversion unit 70, the signal SEL is reset to "0", and peripheral data equivalent to one linescan is added.

(4) The data stored in each of the shift registers 104a, 104b and 104c is compared with the data stored in each of the shift registers 106a, 106b and 106c in the nine Ex-OR gates 109a to 109i which constitute the comparator circuit 110. The respective outputs of the Ex-OR gates 109a to 109i are temporarily loaded into corresponding shift registers (not shown) and at the same time the number of "1" representative of "disagreement" is counted by an associated counter (not shown). The comparator circuit 110 is constructed so as to allow a pattern accuracy within ±1 pixel size while ignoring a discrepancy equivalent to one pixel.

The contents of a shift register which shows the minimum count value are stored in a memory map (not shown).

(5) As the result of retrieval the memory map, if "1"s appear in two or more pixels in succession in any of the longitudinal, lateral or slantwise directions (45 degrees), this is considered to be a case which exceeds the allowance of the aforesaid technical adjustment in which a right or left shift of one pixel is performed in the shift registers 106a and 106c. Accordingly, it is judged that there is a defect.

The result of such judgement with respect to a defect can be visually confirmed by means of a monitor, a printer or the like (not shown), and in addition, data recording is also possible.

Accordingly, in the first preferred embodiment, only if the comparison-check unit 100 is added to the lithographic apparatus, a checking operation is enabled by effectively utilizing the electron-optics-system adjustment unit 60, the bit conversion unit 70, the deflection control unit 80, the scan control unit 62 and the table control unit 64 each of which is used to write a pattern as well as by employing the calibration unit 90 which is normally unused.

This means that it is unnecessary to separately prepare a lithographic apparatus and a checking apparatus, and this achieves a practical value which is superior from the economical viewpoints as well as in terms of a reduction in a space for installation and other operating factors.

Also, since a checking operation can be performed by directly utilizing the electron-optics system 30 of the electron-beam lithographic apparatus, it is possible to eliminate optical errors inherent in the aforesaid optical checking machine of the prior art. Accordingly, it is possible to achieve resolution higher than that of the prior-art optical checking machine, and also a defect of 0.1 μm or less can be detected. This fact ensures high-precision operation of the electron-beam lithographic apparatus.

In addition, it is possible to directly employ a data preparation program and the bit conversion unit 70 used for data format conversion performed in the CPU 50 as well as the scanning functions realized by the deflection control unit 80 or the like. Since it is therefore unnecessary to modify data format for each pattern-writing and checking operations, design data can be applied as it is.

This eliminates errors in the formulation of design data, and reduces an extremely long operating period which must be spent due to the errors. In consequence, it is possible to produce masks rapidly and with high precision.

Moreover, the comparison-check unit 100 is constructed such as to generate a set of parallel data corresponding to a plurality of scans on the basis of peripheral data as initialization data as well as a set of parallel pattern data formed of picked-up image data introduced from the calibration unit 90, the parallel pattern data being shifted one pixel to the right or left (in the direction of a scan). In addition, the comparator circuit 110 is arranged to make a judgement as to the presence or absence of a defect while allowing for the maximum error (in the first embodiment, one pixel or less) which corresponds to the resolution determined for the relevant lithographic operation. Accordingly, it is possible to perform checking operations which are extremely effective in practical terms.

Second Embodiment

The second preferred embodiment differs from the aforesaid first preferred embodiment in respect of the comparison-check unit 100, and specifically that the second embodiment uses a plurality of bits for each stored pixel so that better resolution can be obtained. Therefore, the description relative to the same constituent elements as those of the first embodiment will be omitted for the sake of simplicity.

Figure 10:
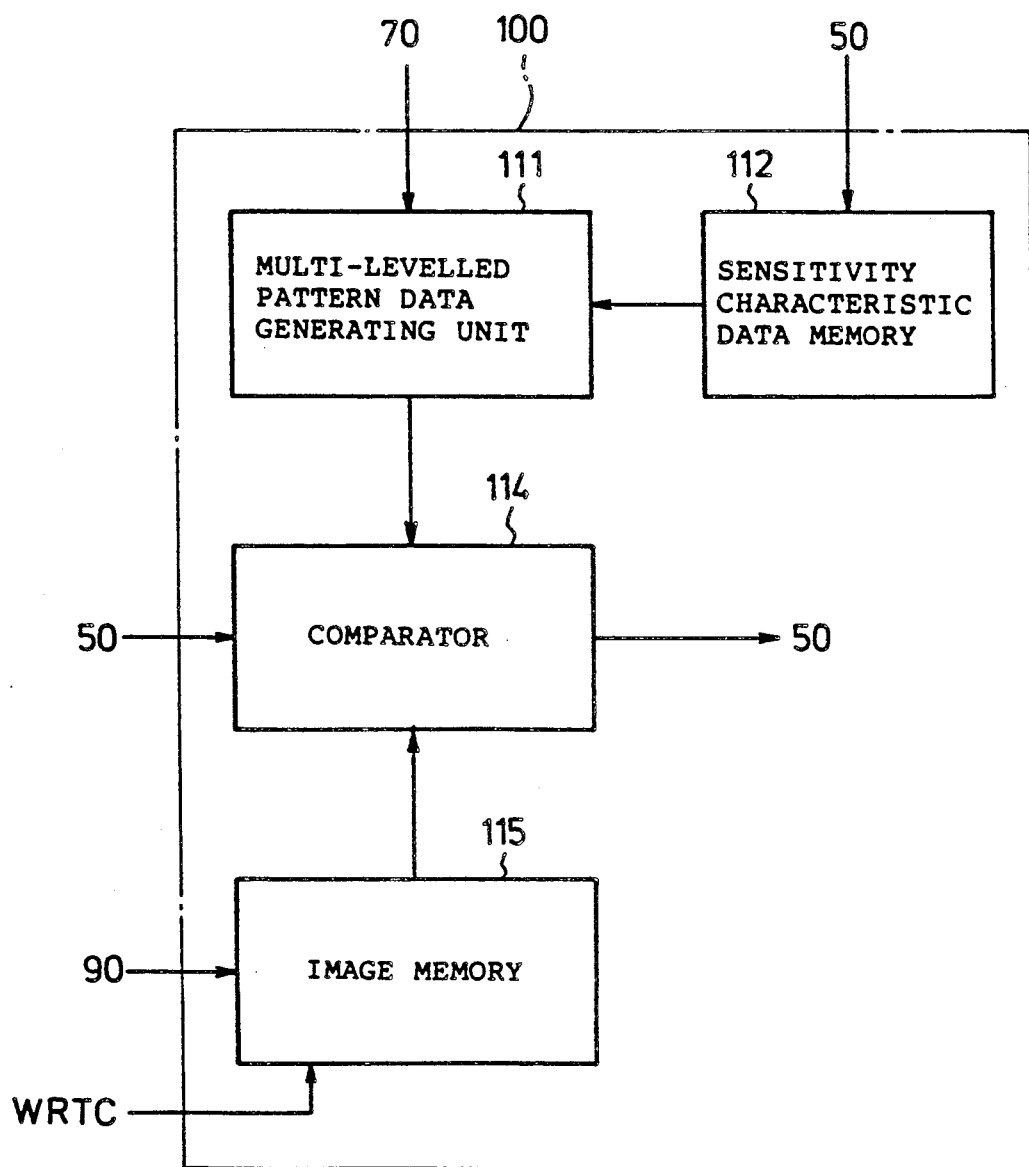
FIG. 10 is a circuit diagram of a second preferred embodiment of the present invention and showing a comparison-check unit used in the same.

As shown in FIG. 10, the comparison-check unit 100 includes a sensitivity characteristic data memory 112, a multi-valued pattern data generating unit 111, which generates an image memory 115 and a comparator 114. The sensitivity characteristic data memory 112 stores therein the sensitivity characteristic data of the reflected-beam detector 39 which is supplied from the CPU 50. The multi-levelled pattern data generating unit 111 generates multi-levelled pattern data, which is a multiple-bit digital signal, by superimposing the data stored in the sensitivity characteristic data memory 112 upon the parallel pattern data supplied from the bit conversion unit 70. The image memory 115 stores therein multiple bits of digital data which are picked-up image data supplied from the calibration unit 90. The comparator 114 is arranged to detect a defect by comparing the multiple bits of data derived from the design data and the picked-up image data, respectively, which are stored in the multi-levelled pattern data generating unit 111 and the image memory 115.

The image memory 115 is capable of storing therein a set of data equivalent to several linescans, and making comparison while allowing for ±1 pixel as in the case of the aforesaid first embodiment.

Figure 11:
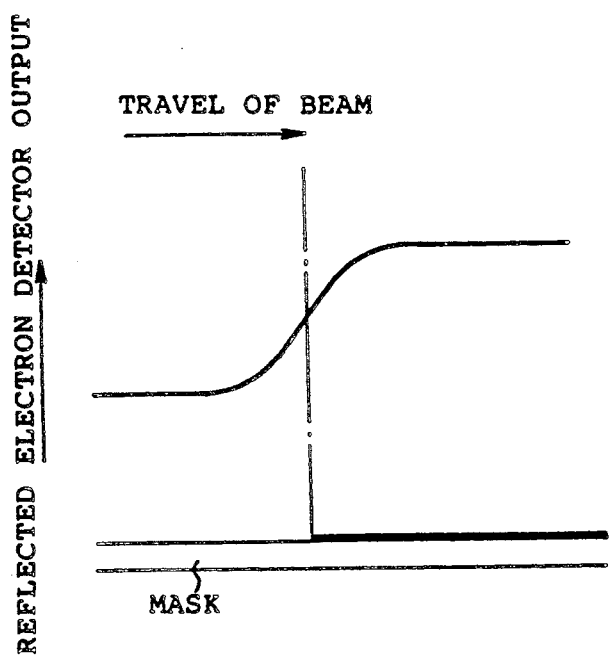
FIG. 11 is a chart of the sensitivity characteristic curve.

The picked-up data is stored in the image memory 115 in response to a write clock WRTC which is synchronized with beam scans on the basis of the timing signal generated by the scan control unit 62 and has a one-clock cycle coincident with the size of one pixel. On the other hand, the design data is converted to multiple bit data by the multi-levelled pattern data generating unit 111. For this reason, while the electron-optics system 30 is performing an automatic calibration in preparation for a checking operation, the sensitivity characteristics provided along the edge of a mask pattern is measured by the reflected-beam detector 39. An analog signal which varies smoothly as shown in FIG. 11 is converted to a digital signal which is a multiple bit wave. The multi-levelled wave is stored in the magnetic disc unit 41 via the CPU 50 and at the same time in the sensitivity characteristic data memory 112.

Subsequently, the comparator 114 compares the picked-up image data and the design data. If the comparator 114 detects a pixel which shows a level exceeding a threshold value specified by the CPU 50, the comparator 114 judges that the pixel is a defect.

Accordingly, since the comparison-check unit 100 is constructed such as to compare the picked-up image data relative to a mask and design data both of which are converted to corresponding multiple bit pattern data, the result of the comparison includes information representing the tones of them. This produces a superior effect in that a half-tone defect can also be detected because more than one bit of resolution is used.

This means that, in the case of checking pixel sizes having the same size, the resolution of the second embodiment (multiple level and multiple bit) has an improvement over that of the first embodiment (binary data mode).

Third Embodiment

As in the case of the second embodiment, the third embodiment differs from the aforesaid first embodiment in respect of the comparison-check unit 100.

More specifically, the first embodiment compares data in a binary mode while the second embodiment compares data in a multi-levelled multiple bits digital mode. The third embodiment makes comparison in an analog mode instead of the digital mode of the aforesaid embodiments. Therefore, the description will be omitted with respect to the same constituent elements as those of the first embodiment.

Figure 12:
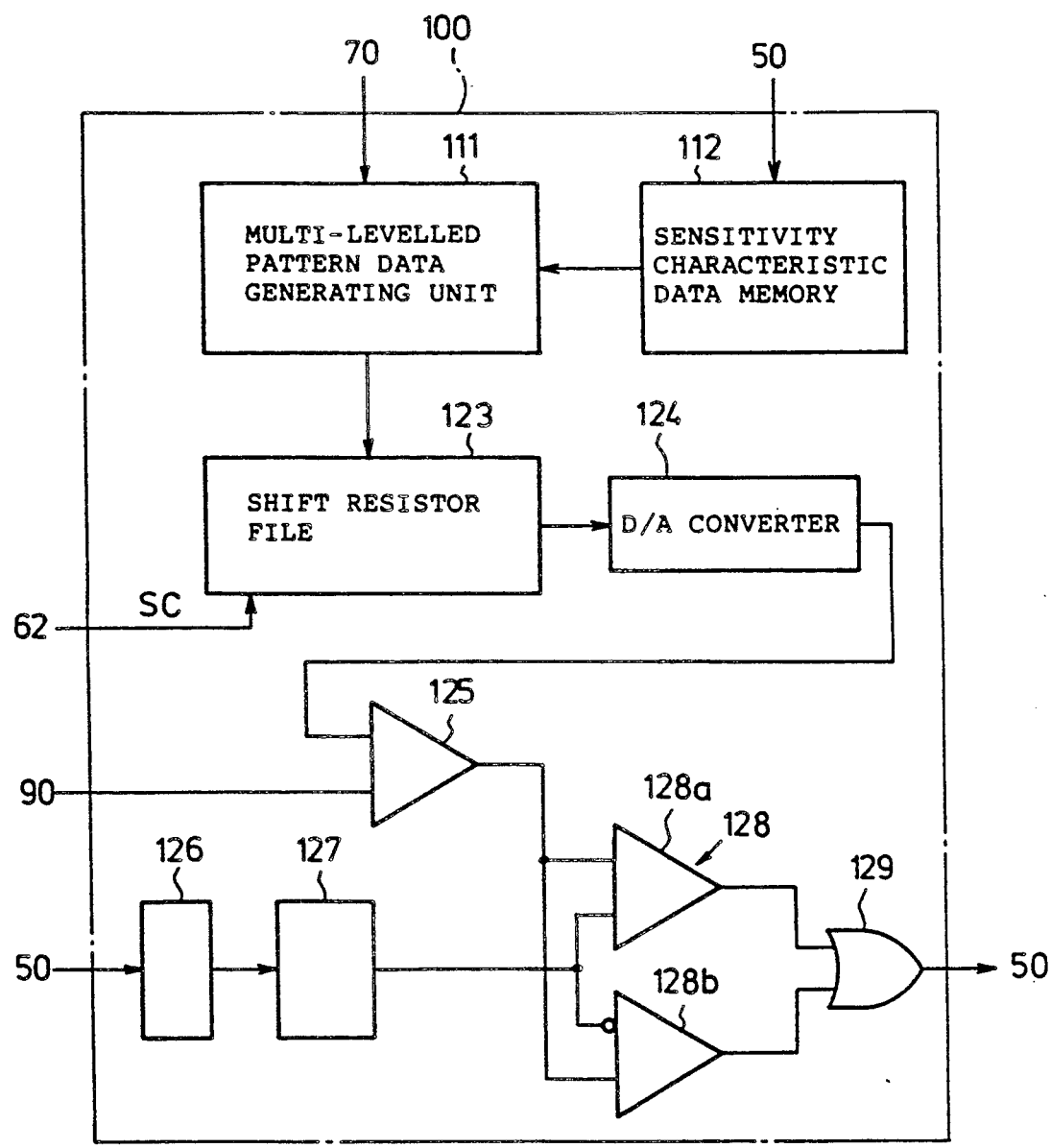
FIG. 12 is a circuit diagram of a third preferred embodiment of the present invention and showing a comparison-check unit used in the same.

As shown in FIG. 12, the comparison-check unit 100 serving as comparison-check means constituting the third embodiment includes a shift register file 123, a D/A converter 124, an analog subtracter 125, a pair of comparators 128a, 128b and an OR gate 129. The shift register file 123 is arranged so that multi-levelled data (design data) corresponding to one linescan may be loaded thereinto from the multi-levelled pattern data generating unit 111. The shift register file 123 outputs data in a serial manner on the basis of a shift clock SC supplied from the scan control unit 62, and the D/A converter 124 converts the serial output data to an analog signal. The analog subtracter 125 compares the analog signal of the D/A converter 124 with an analog signal which is output as a picked-up image date from the calibration unit 90. Each of the comparators 128a and 128b compares the signal output from the analog subtracter 125 with the threshold value specified by the CPU 50 via register 126 and the D/A converter 127. As the result of the comparison performed by the comparators 128a and 128b, if the resultant absolute value exceeds the threshold value, the OR gate judges that a defect exists.

Accordingly, in the third embodiment as well, pattern writing and a check thereof can be performed rapidly and with high precision as in the case of the first embodiment.

Although the electron-beam lithographic apparatus is essentially constituted by the apparatus body 200 and the control section 300 in the respective embodiments, the arrangement of the present invention is not confined solely to the aforesaid arrangements. For example, the bit conversion unit 70, the deflection control unit 80, the scan control unit 62 and the like are merely divided in functional terms for the sake of convenience. Accordingly, they may be formed as integrated hardware because all that are required is that a pattern can be written by means of the electron beam under blanking control on the basis of design data (source data).

The respective embodiments are arranged to check a mask obtained from the plate 5 subjected to pattern writing followed by a predetermined processing. However, even in a case where a pattern is written directly on a wafer, since the present invention is capable of checking the pattern written on the wafer, the invention is applicable to such a case. Also, the "scan" referred to in the previous description is not limited to an arrangement in which an electron beam is continuously scanned over a plate. For example, the present invention is applicable to even a vector-scan or variable-shaped-beam lithographic apparatus in which only a desired pattern area is exposed so as to write a pattern thereon. This is because such lithographic apparatus can be easily operated in a check mode by selecting a raster scan.

As described above, the present invention achieves remarkable effects in that a pattern can be written under blanking control as well as in that the pattern written on a mask can be checked rapidly and with high precision utilizing the same design data and constituent elements that are employed for pattern writing.

What is claimed is:

1. An electron-beam lithographic apparatus for exposing a plate to an electron beam which is selectively blanked on the basis of a set of design data, thereby writing a predetermined pattern over said plate to form a mask, and for checking the resultant mask, comprising:

image pattern data generating means for generating design pattern data indicative of a desired pattern for said plate;

means for exposing said plate using said design pattern data;

image detecting means for detecting electrons reflected from a mask disposed in place of said plate to pick up an image of a pattern formed on said mask;

picked up image data detecting means for receiving multiple bit digital picked-up image data from an output of said image detecting means in correspondence with said design pattern data; and comparison-check means for automatically detecting a defect in said pattern formed on said mask, by comparing said design pattern data with said picked-up image pattern data, so that said mask is checked while said electron beam is being scanned, wherein said comparison-check means includes:

multiple-bit pattern data generating means, storing sensitivity characteristic data which is indicative of a sensitivity of said image detecting means, for superimposing said design pattern data and said sensitivity characteristic data and generating multiple-bit digital design pattern data, an image memory for storing therein multiple-bit image pattern data supplied from said picked-up image data detecting means; and comparator means for comparing bits of said multiple bit digital design pattern data from said multiple bit pattern data generating means and said multiple bit digital picked-up image data from aid image memory, and for determining that no defect exits when said bits of said multiple bit digital design pattern data and said bits of said multiple bit digital picked-up image data agree.

2. An apparatus as in claim 1 wherein said comparator means includes means for comparing each digital bit of said multiple bit digital pattern data with each digital bit of said multiple bit digital picked-up image data, and for determining a defect exists when the values disagree by a predetermined amount.

3. An apparatus as in claim 2 wherein said means for comparing includes an exclusive OR-gate.

4. An electron-beam lithographic apparatus for exposing a plate to an electron beam which is selectively blanked on the basis of a set of design data, thereby writing a predetermined pattern over said plate to form a mask, and for checking the resultant mask, comprising:
  means for storing therein a set of design data indicative of a predetermined pattern;
  means for generating pattern data based on said stored design data;
  a lithographic-apparatus body including: means for exposing said plate with an electron beam based on said pattern data; means for movably supporting said plate; beam control means; and image detecting means for detecting electrons reflected from a mask disposed on said supporting means instead of said plate to pick up an image of a pattern formed on said mask;
  a CPU for controlling said lithographic-apparatus body based on said pattern data; and
  an interface unit disposed between said CPU and said lithographic-apparatus body and including a plurality of control units, said interface unit including: a calibration unit for forming image data by adjusting an output from said image detecting means to compensate for calibration; and a comparison-check unit for automatically comparing said image data with said pattern data to check said pattern formed on said mask so as to detect defects in said mask, wherein said comparison-check means includes:
    a first storage means for storing therein said design pattern data which is binary-coded on the basis of said design data;
    a second storage means for storing therein image data which is binary-coded, and
    means for comparing said design pattern data stored in said first storage means and said picked-up image pattern data stored in said second storage means to determine whether or not said picked-up pattern data agrees with said design pattern data, so that defects in said pattern formed on said mask may be detected.

5. An electron-beam lithographic apparatus according to claim 4, wherein said pattern data generating means includes a readout unit for sending out a blanking signal in accordance with said pattern data, said readout unit also sending parallel pattern data to said comparison-check unit.

6. An electron-beam lithographic apparatus according to claim 4, wherein said comparator circuit includes means for allowing for a discrepancy in position equivalent to ± one pixel.

7. An apparatus as in claim 4 wherein said comparator means includes means for comparing each digital bit of said multiple bit digital pattern data with each digital bit of said multiple bit digital picked-up image data, and for determining a defect exists when the values disagree by a predetermined amount.

8. An apparatus as in claim 7 wherein said means for comparing includes an exclusive OR-gate.

9. An electron-beam lithographic apparatus for exposing a plate to an electron beam which is selectively blanked on the basis of a set of design data, thereby writing a predetermined pattern over said plate to form a mask, and for checking the resultant mask comprising:
  image pattern data generating means for generating design pattern data indicative of a desired pattern for said plate;
  means for exposing said plate using said design pattern data;
  image detecting means for detecting electrons reflected from a mask disposed in place of said plate to pick up an image of a pattern formed on said mask;
  picked-up image data detecting means for receiving picked-up image data from an output of said image detecting means in correspondence with said design pattern data and producing a analog signal indicative thereof; and
  comparison-check means for detecting a defect in said pattern formed on said mask, by comparing said design pattern data with said picked-up image pattern data, so that said mask is checked while said electron beam is being scanned,
  wherein said comparison-check means includes:
    a multiple bit digital pattern data generating means, storing sensitivity characteristic data, which is indicative of a sensitivity of said image detecting means, for correlating said design pattern data and said sensitivity characteristic data to generate multiple-bit digital design pattern data indicative of said desired pattern;
    a D/A converter for receiving said multiple bit digital design pattern data from said multiple-bit digital pattern data generating means and converting it into an pattern data indicative analog signal;
    an analog subtracter for subtracting said pattern data indicative analog signal from an analog signal representative of picked-up image data supplied from said picked-up image data detecting means; and
    analog comparator means for comparing an absolute value of an output of said analog subtracter with a predetermined threshold value and for determining that a defect exists when said absolute value exceeds said predetermined threshold value.

10. An apparatus as in claim 9, wherein said picked-up image data detecting means includes means for receiving up a digital signal indicative of an image, and a D/A converter for converting said digital signal into said analog signal.

11. An apparatus as in claim 9 wherein said picked-up image data detecting means includes calibration means for forming a signal indicative of an output of said image detecting means, which is adjusted for calibration of components of said lithographic apparatus.

12. An apparatus as in claim 9 wherein said analog comparator means includes a first comparator for comparing said output of said analog subtractor with said predetermined threshold voltage, and a second comparator for comparing said output of said analog comparator with an inverse of said predetermined threshold voltage, and means for determining that said defect exists when either of said signals indicates a comparison beyond said threshold.

* * * * *